(12) United States Patent
Hamada (10) Patent No.: US 6,765,401 B2
(45) Date of Patent: Jul. 20, 2004

(54) SEMICONDUCTOR TESTING APPARATUS FOR CONDUCTING CONDUCTION TESTS

(75) Inventor: Morihiko Hamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/335,947

(22) Filed: Jan. 3, 2003

(65) Prior Publication Data

US 2003/0222670 A1 Dec. 4, 2003

(30) Foreign Application Priority Data

May 28, 2002 (JP) ........................................ 2002-153791

(51) Int. Cl.[7] .............................................. G01R 31/02
(52) U.S. Cl. ...................................... 324/760; 324/765
(58) Field of Search ............................. 324/158.1, 731, 324/760, 754, 761, 765; 439/482; 165/80.3, 80.4

(56) References Cited

U.S. PATENT DOCUMENTS 3,963,985 A * 6/1976 Geldermans ................. 324/754
5,124,639 A * 6/1992 Carlin et al. ................. 324/760
5,325,052 A * 6/1994 Yamashita ................... 324/754

FOREIGN PATENT DOCUMENTS

JP          05-152389         6/1993

* cited by examiner

*Primary Examiner*—Vinh P. Nguyen
(74) *Attorney, Agent, or Firm*—Arent Fox PLLC

(57) ABSTRACT

A semiconductor testing apparatus for conducting a conduction test after stabilizing contact between probing pins and a wafer is provided. The semiconductor testing apparatus includes a heat transfer block which is contacted to the probing pins to adjust the temperature of the probing pins to a predetermined testing temperature before the probing pins are brought into contact with the wafer.

20 Claims, 9 Drawing Sheets

SEMICONDUCTOR TESTING APPARATUS FOR CONDUCTING CONDUCTION TESTS

CROSS-REFERENCED TO RELATED APPLICATIONS

This application is based upon and claims the benefit of priority from the prior Japanese Patent Application No. 2002-153791, filed on May 28, 2002, the entire contents of which are incorporated herein by reference.

BACKGROUND OF THE INVENTION

The present invention relates to a semiconductor testing apparatus for conducting a probing test on a semiconductor device or a substrate.

To effectively test a plurality of circuits formed on a semiconductor wafer, a probing card has 600 to 800 probing pins. Some of the probing cards manufactured presently have more than 1000 probing pins, adjacent ones of which have a spacing of 40 micrometers or less therebetween.

Since an electronic product, such as a cellular phone or a vehicle-mounted element, is used within a relatively wide temperature range, a circuit employed in such an electronic product is also tested over a wide range of temperatures. In a probing test, it is necessary to bring the probing pins into contact with the circuits substantially uniformly independently of a testing temperature.

Generally, in the step of manufacturing a semiconductor device, a probing test is conducted to test the conduction of a wafer. In the probing test, a plurality of probing pins are brought into contact with a plurality of corresponding pads formed on the wafer at a predetermined pressure. The various characteristics of the semiconductor device are measured in accordance with a probing test program.

The probing pins each elongate at a high test temperature and are shortened at a low test temperature. Accordingly, a pressure of contact between the pad and the probing pin varies, thus making the probing test unstable conventionally. The following will describe a conventional testing method by which an influence of a temperature variation in length of the probing pins is reduced.

Figure 1:
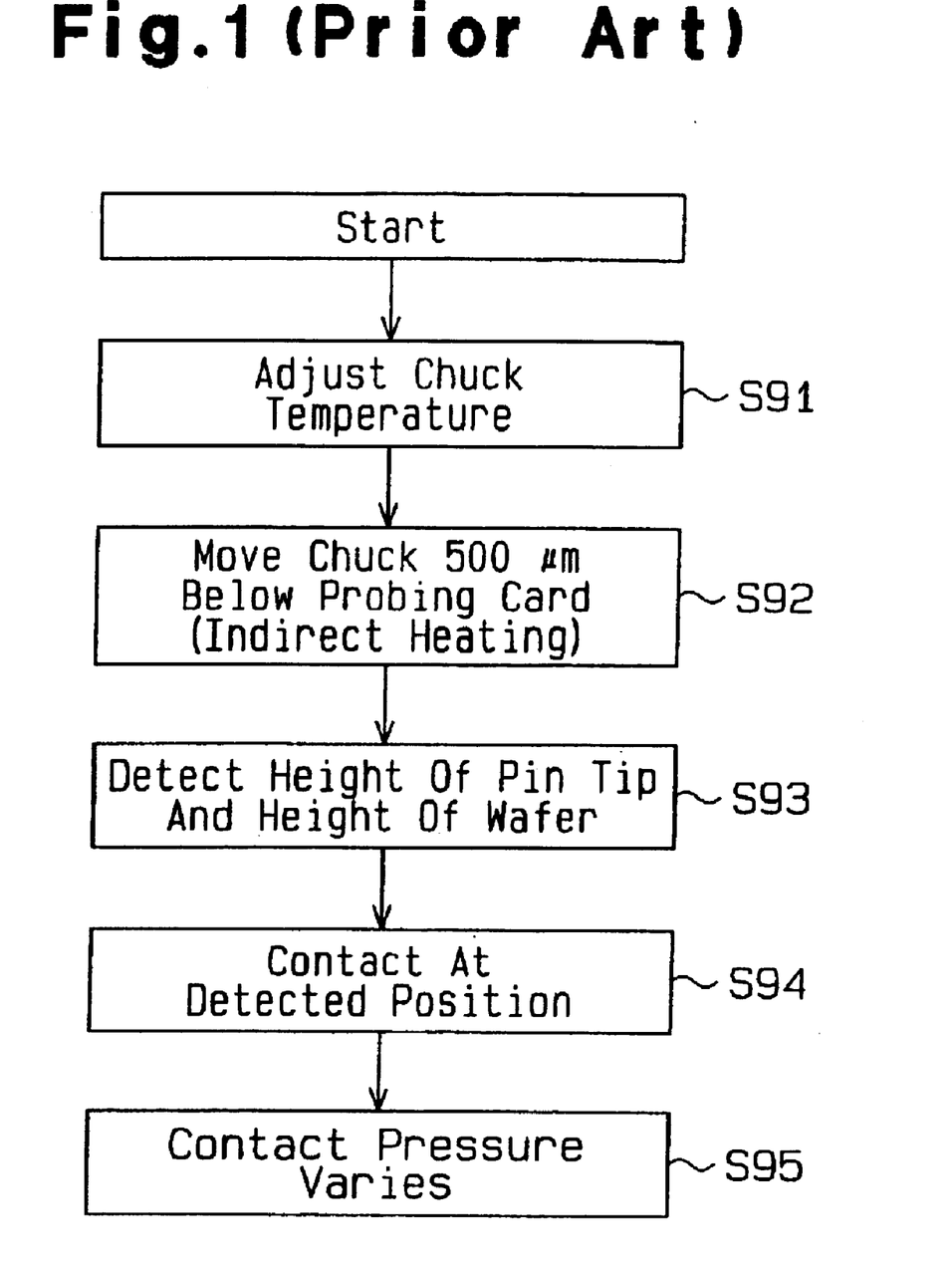
FIG. 1 is a flowchart of a conventional semiconductor testing method.
Figure 2:
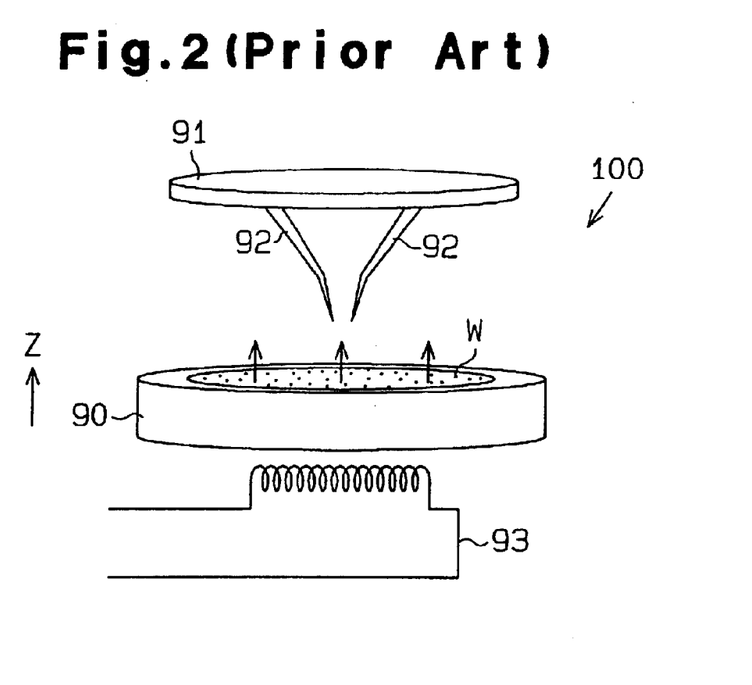
FIG. 2 is a schematic diagram of a conventional semiconductor testing apparatus.

FIG. 1 is a flowchart of a conventional probing test. FIG. 2 shows a conventional semiconductor testing apparatus 100. The semiconductor testing apparatus 100 includes a chuck 90 on which a wafer W is placed, a probing card 91 having probing pins 92, and a heater 93 for heating the wafer W.

When the probing test starts, the semiconductor testing apparatus 100 holds the chuck 90 at a predetermined testing temperature after heating with the heater 93 in step S91. In step S92, the semiconductor testing apparatus 100 moves the chuck 90 to a position which is separate downward from the probing card 91 by a predetermined spacing, for example, 500 micrometer. The chuck 90 radiates heat to pre-heat the probing pins 92. The pre-heating time ranges from a few minutes to several tens of minutes corresponding to the size of the probing card 91.

In step S93, the semiconductor testing apparatus 100 monitors the tip of the probing pin 92 and the upper surface of the wafer W using a camera (not shown) to simultaneously calculate the height of the chuck 90 when the tip of the probing pin 92 is brought into contact with the upper face of the wafer W.

In step S94, the semiconductor testing apparatus 100 moves the chuck 90 to the height thus calculated and brings the tip of the probing pin 92 into contact with the wafer W and then conducts a conduction test.

It is to be noted that since in the conventional semiconductor testing apparatus 100, the probing pin 92 is pre-heated indirectly in the position which is separate from the chuck 90, its temperature is saturated before the probing pin 92 reaches the testing temperature. The temperature of the probing pin 92, therefore, is lower than the testing temperature, or the temperature of the wafer W.

Figure 3:
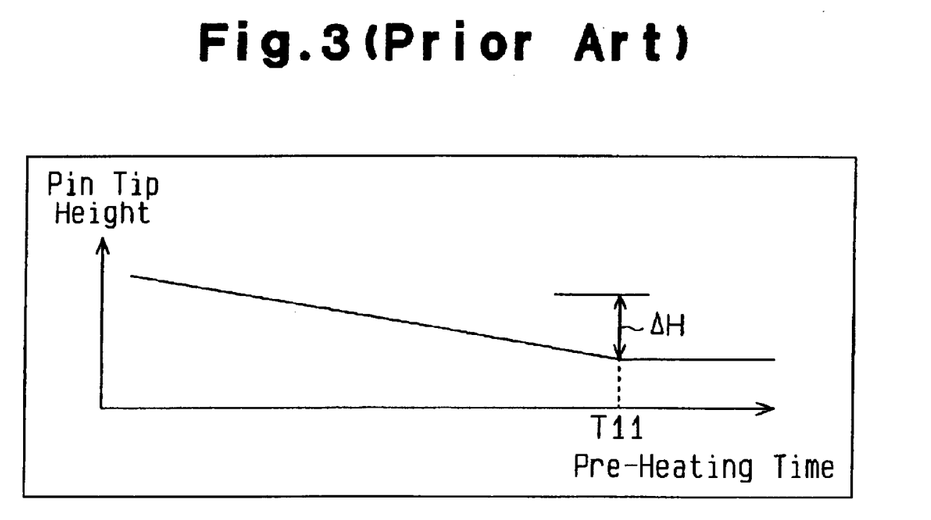
FIG. 3 is a graph for showing a variation in height of a tip of a probing pin.

FIG. 3 is a graph for showing the relationship between the pre-heating time and the height of the tip of the probing pin 92. The height of the tip of the probing pin 92 was measured along the z-axis of FIG. 2 in a condition where the probing card 91 is fixed. As the pre-heating time is prolonged, the probing pin 92 is elongated by heating, resulting in a decrease in the height of the tip thereof. At a time T11, the probing pin 92 has temperature saturation and so stops elongating, thus causing the height of the tip also to stop decreasing. From the time T11 on, the tip is kept at a substantially constant height. A fluctuation ΔH in the height of the tip owing to pre-heating is about a few tens of micrometers.

During the conduction test, the probing pin 92 is in contact with the wafer W, so that the probing pin 92 is heated by the wafer W to the testing temperature. Therefore, the probing pin 92 elongates further, thus decreasing the height of the tip thereof. Accordingly, a pressure of contact between the probing pin 92 and the wafer W varies greatly during the conduction test (step S95).

In the case of cooling the wafer W down to the testing temperature in order to conduct a probing test, on the other hand, a cooling circuit is used instead of the heater 93. In this case, the probing pin 92 is pre-cooled above the chuck 90 and so shrinks, thus increasing the height of the tip thereof. Furthermore, indirect pre-cooling causes the temperature of the probing pin 92 to become higher than that of the wafer W.

Figure 4:
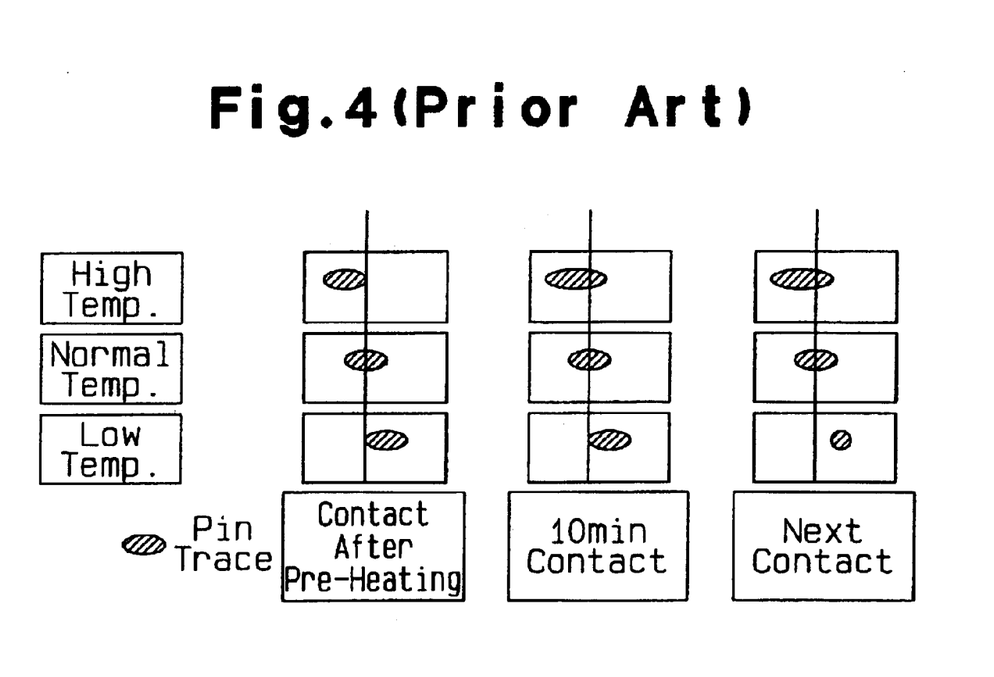
FIG. 4 shows a pin trace formed on a wafer owing to contact with the probing pin.

FIG. 4 is an illustration for showing a pin trace formed by contact between the probing pin 92 and the wafer W.

At the middle row in FIG. 4 is shown a pin trace formed in the test at the normal temperature. In this case, the pin trace stayed substantially in a constant position at a time immediately after contact of the probing pin 92 with the wafer W, at a time ten minutes after contact, and at a time of contact in the next position. This is because the temperatures of the probing pin 92 and the wafer W do not vary even when they come in contact with each other.

At the upper row in FIG. 4, on the other hand, is shown a pin trace in the test at a high temperature. In this case, although immediately after contact, the pin trace has a shift in position corresponding to the elongation of the tip of the probing pin 92 owing to pre-heating, the pin trace geometry stays the same as that at the normal temperature. However, as the probing pin 92 is heated by contact with the wafer W to the testing temperature, the probing pin 92 elongates, so that the pin trace expands and becomes large.

At the lower row in FIG. 4 is shown a pin trace formed in the test at a low temperature. In this case, although immediately after contact, the pin trace has a shift in position corresponding to the shortening of the tip of the probing pin 92 owing to pre-cooling, the pin trace geometry stays the same as that at the normal temperature. However, as the probing pin 92 is cooled by contact with the wafer W down to the testing temperature, the probing pin 92 shortens, so that the pin trace is shortened and small.

In the conventional semiconductor testing apparatus 100, therefore, the pressure of contact between the probing pin 92 and the wafer W is unstable, thus likely to give rise to poor contact.

In a conduction test, the probing pin 92 is brought into contact with an electrode (pad) formed on the wafer W. If slippage (scrubbing quantity) of the probing pin 92 is large, the pin trace goes out of the relatively small electrode into a bonding region, thus deteriorating the strength thereof.

Japanese Laid-open Patent Publication No. Hei 5-152389 discloses a probing card and a test bench which have a heating body (or cooling body) buried therein. The heating body (or cooling body) causes the probing card (probing pin) and the test bench to have the same temperature. Accordingly, a fluctuation of a probing pin temperature owing to contact between the probing pin and the wafer is suppressed to suppress the elongation of the probing pin. It is necessary, however, to provide the heating body (or cooling body) for each probing card, so that costs are increased for testing and the manufacture of the semiconductor testing apparatus. Furthermore, the heating body in the probing card is electrified, so that test results may be affected by noise.

BRIEF SUMMARY OF THE INVENTION

It is an object of the present invention to provide a semiconductor testing apparatus which can conduct a test stably on a semiconductor device. It is another object of the present invention to provide a semiconductor testing apparatus which can bring a probing pin into contact with a semiconductor device at a stable pressure.

To achieve the above object, the present invention provides an apparatus for testing a test piece. The apparatus includes a test bench for supporting the test piece while maintaining the test piece at a predetermined testing temperature, and probing pins which are brought into contact with the test piece. A heat transfer block is brought into contact with the probing pins to adjust a temperature of the probing pins to the testing temperature.

A further perspective of the present invention is a method for testing a semiconductor wafer by contacting a plurality of probing pins to the semiconductor wafer. The method includes maintaining the wafer at a predetermined testing temperature, maintaining a heat transfer block at the testing temperature, contacting the tips of the plurality of probing pins to the heat transfer block until a temperature of the plurality of probing pins reaches the testing temperature, and contacting the plurality of probing pins to the wafer.

Other aspects and advantages of the present invention will become apparent from the following description, taken in conjunction with the accompanying drawings, illustrating by way of example the principles of the invention.

BRIEF DESCRIPTION OF THE SEVERAL VIEWS OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 9A:
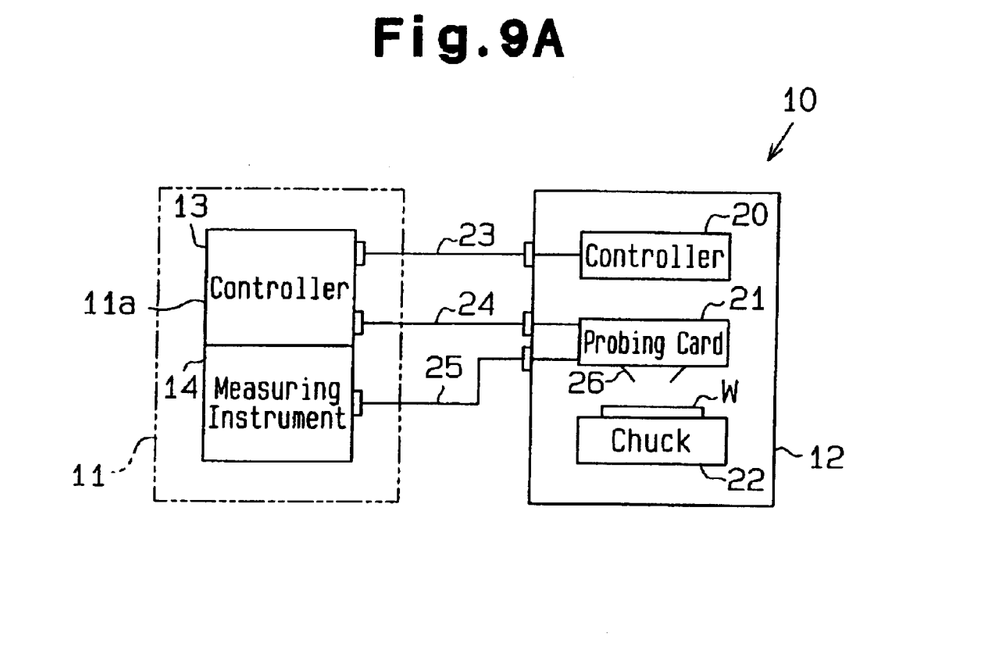
FIGS. 9A and 9B are block diagrams for showing the semiconductor testing apparatus.

The following will describe a semiconductor testing apparatus 10 according to a first embodiment of the present invention. As shown in FIG. 9A, the semiconductor testing apparatus 10 includes a tester 11 and a wafer prober 12 connected to the tester 11.

The tester 11 includes a measurement control unit 11a comprised of a main controller 13 and a measuring instrument 14. The wafer prober 12 includes a chuck controller 20, a probing card 21 having a plurality of probing pins, and a disc-shaped test bench, or chuck 22. On the chuck 22 is placed a test piece or a semiconductor wafer W on which electronic circuits such as an IC or an LSI are formed. The main controller 13 is connected to the chuck controller 20 through a control cable 23 and to the probing card 21 through a probing card control cable 24. The measuring instrument 14 is connected to the probing card 21 through an output cable 25. The output cable 25 is arranged, between the probing card 21 and the measuring instrument 14, as an interface for transferring data in a serial format in, for example, GP-IB communication.

The main controller 13 supplies a control signal through the control cable 23 to the chuck controller 20. The chuck controller 20 controls the chuck 22 in accordance with the control signal to move the chuck 22 so that the wafer W contacts with the probing pin 26 at a predetermined pressure.

The main controller 13 controls the probing card 21 through the probing card control cable 24. The probing card 21 supplies the measuring instrument 14 with a test result of the wafer W through the output cable 25. The main controller 13 evaluates the test result of the wafer W.

Figure 9B:
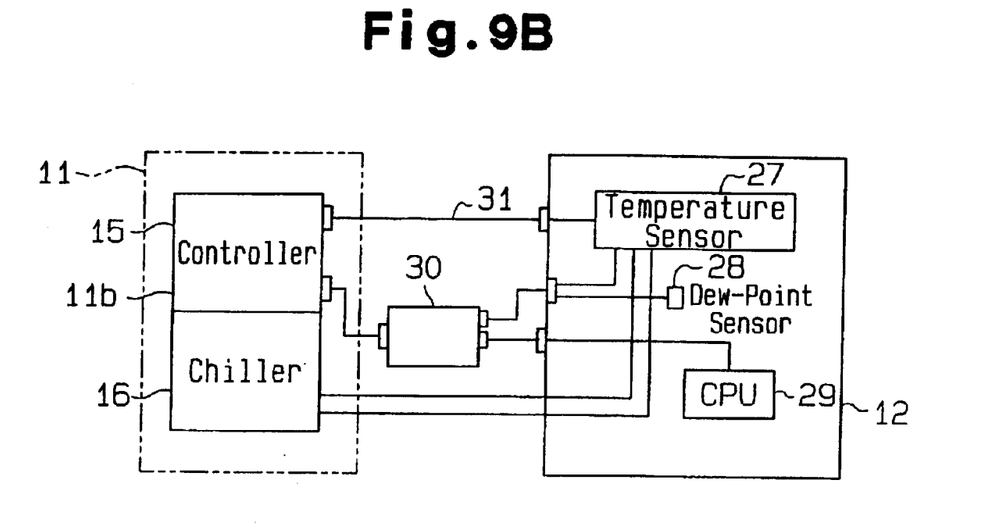

As shown in FIG. 9B, the tester 11 includes a temperature control unit 11b comprised of a temperature controller 15 and a chiller 16. The prober 12 includes a temperature sensor 27 which detects the surface temperature of the chuck 22, a dew-point sensor 28 which detects a dew point, and a CPU29 which detects a flow rate of a coolant liquid flowing from the chiller 16 to the wafer prober 12. The temperature sensor 27, the dew-point sensor 28, and the CPU29 are connected to the temperature controller 15 via a monitor unit 30. The monitor unit 30 supplies the temperature controller 15 with a monitor result (the surface temperature and the dew point of the chuck 22 and the flow rate of the coolant liquid).

The temperature controller 15 is connected to the wafer prober 12 through a control cable 31. The temperature controller 15 generates a temperature control signal based on a monitor result given by the monitor unit 30 and supplies this temperature control signal to the wafer prober 12 through the control cable 31.

Next, the probing card 21 and the chuck 22 will be described in detail.

Figure 5:
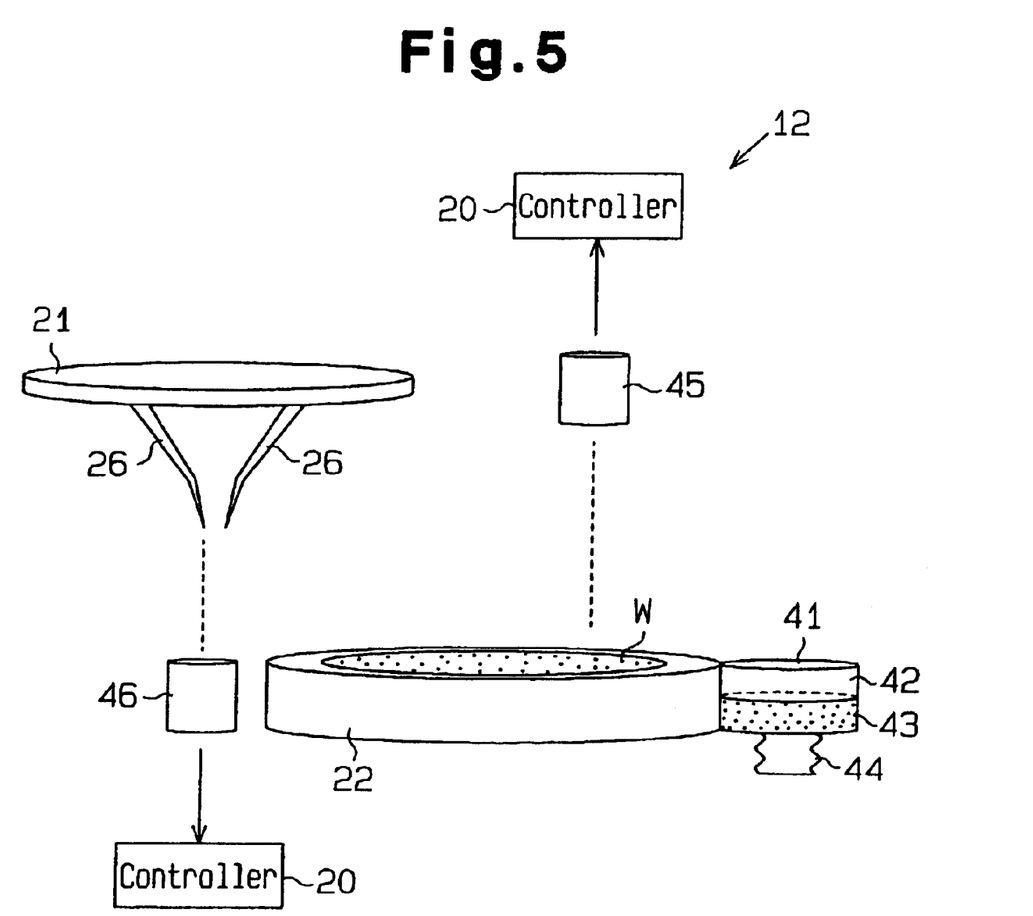
FIG. 5 shows a semiconductor testing apparatus according to a first embodiment of the present invention.

As shown in FIG. 5, the wafer prober 12 includes a heat transfer block 41 provided adjacent to the chuck 22. The heat transfer block 41 is a cylinder having a bottom area enough to bring the tips of all the probing pins 26 into contact with the wafer W at the same time. Preferably the heat transfer block 41 is arranged so that an axis thereof may be nearly parallel to those of the probe card 21 and the chuck 22.

The heat transfer block 41 is axially divided into two parts. The upper part of the heat transfer block 41 provides a contact member 42 and the lower part thereof, a support bench 43. The contact member 42 and the support bench 43 are replaceable. The contact member 42 can be removed from the support bench 43 by, for example, suction force.

The contact member 42 is preferably made of a high-resistance material having excellent heat conduction, for example, a ceramic such as an alumina oxide. In this case, the temperatures of the heat transfer block 41 and the chuck 22 are readily adjusted to a predetermined testing temperature, while the probing pin 26 is prevented from short-circuiting with the contact member 42 when it has come in contact therewith. The contact member 42 may be made of metal hardened and insulated. In this case, the contact member 42 is suppressed from being deteriorated. Preferably the upper surface of the contact member 42 is substantially at the same level as that of the chuck 22.

The support bench 43 is provided, on a bottom thereof, with a pressure absorber 44 for holding a pressure of contact between the contact member 42 and the probing pin 26 to a substantially constant value. The pressure absorber 44 has a displacement mechanism of a hydraulic type by use of an oil pressure or an air pressure or of a spring type. The pressure absorber 44 displaces the heat transfer block 41 in accordance with a fluctuation of a contact pressure between the contact member 42 and the probing pin 26. In such a manner, the contact member 42 is brought into contact with the probing pin 26 stably. The pressure absorber 44 absorbs a load of about 1 kg through several kilograms corresponding to that of, for example, from several to several hundreds of the probing pins 26. The support bench 43 is fixed to a pedestal (not shown) which carries the chuck 22 via the pressure absorber 44. Therefore, the heat transfer block 41 moves integrally with the chuck 22.

The prober 12 includes a first camera 45 for measuring the position (height) of the upper surface of the chuck 22 (wafer W) or the heat transfer block 41. The first camera 45 is fixed to the frame of the wafer prober 12. The first camera 45 supplies image data to the chuck controller 20. The chuck controller 20 recognizes that the chuck 22 (wafer W) or the heat transfer block 41 is placed at a reference position when the upper surface of the chuck 22 (wafer W) or the heat transfer block 41 is aligned with the focus of the first camera 45.

The prober 12 includes also a second camera 46 for measuring the position (height) of the tip of the probing pin 26. The second camera 46 is fixed to the frame of the wafer prober 12. The second camera 46 supplies image data to the chuck controller 20. The chuck controller 20 recognizes that the probing pin 26 (probing card 21) is placed at a reference position when the tip of the probing pin 26 is aligned with the focus of the second camera 46.

After the chuck 22 (wafer W) or the heat transfer block 41 is placed in the reference position and the probing pin 26 is placed in the reference position, the chuck controller 20 aligns the upper surface of the chuck 22 (wafer W) or the heat transfer block 41 and the tip of the probing pin 26 with each other. That is, the chuck controller 20 moves the chuck 22 and the heat transfer block 41 so that the upper surface of the chuck 22 (wafer W) or the heat transfer block 41 may come in contact with the tip of the probing pin 26 at the predetermined pressure.

Figure 6A:
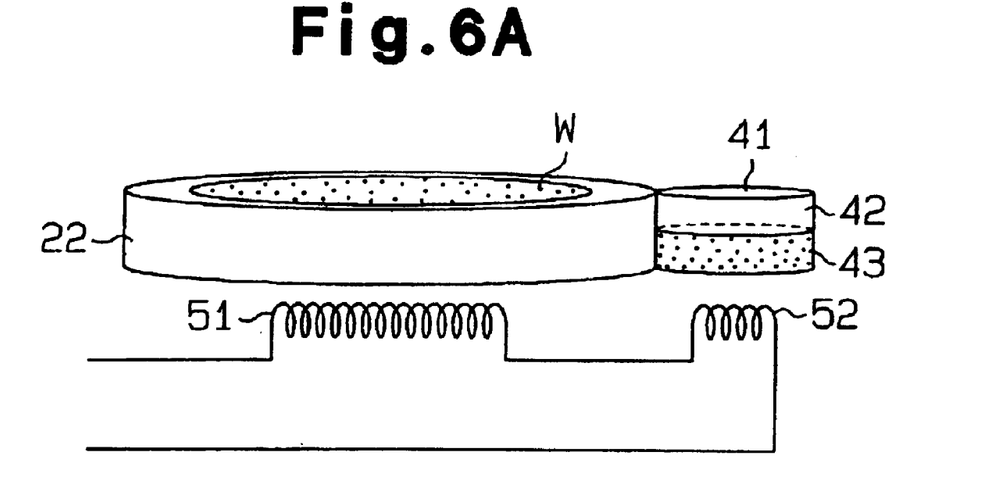
FIG. 6A is a schematic diagram for showing a heating system for a chuck and a heat transfer block.

As shown in FIG. 6A, the wafer prober 12 is provided with a chuck heater 51 and a heat transfer block heater 52 adjacent to the chuck 22 and the heat transfer block 41 respectively. The chuck heater 51 and the heat transfer block heater 52 are connected in series and energized in accordance with the temperature control signal sent from the temperature controller 15 to heat the wafer W and the heat transfer block 41 to the predetermined testing temperature.

Figure 6B:
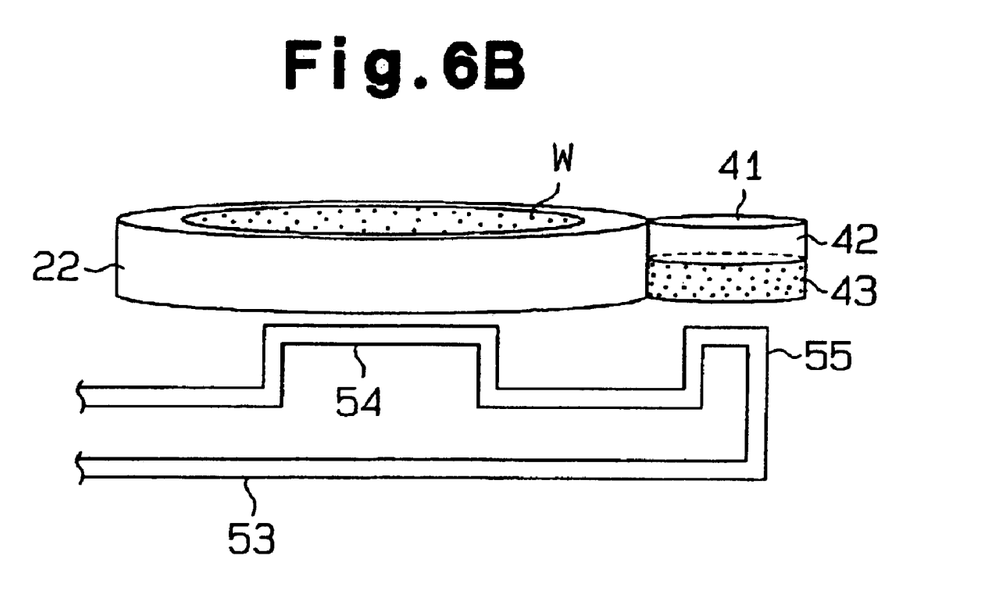
FIG. 6B is a schematic diagram for showing a cooling system for a chuck and a heat transfer block.

As shown in FIG. 6B, the wafer prober 12 is provided also with a cooling circuit 53 including a chuck cooling unit 54 and a heat transfer block cooling unit 55 adjacent to the chuck 22 and the heat transfer block 41 respectively. The cooling circuit 53 is connected to the chiller 16. A coolant flows through the cooling circuit 53 to cool the chuck 22 and the heat transfer block 41 down to the predetermined testing temperature. The flow rate of the coolant is controlled in accordance with the temperature control signal sent from the temperature controller 15. The heaters 51 and 52, the cooling circuit 53, the cooling units 54 and 55 and the chiller 16 form a temperature setting element.

Figure 7:
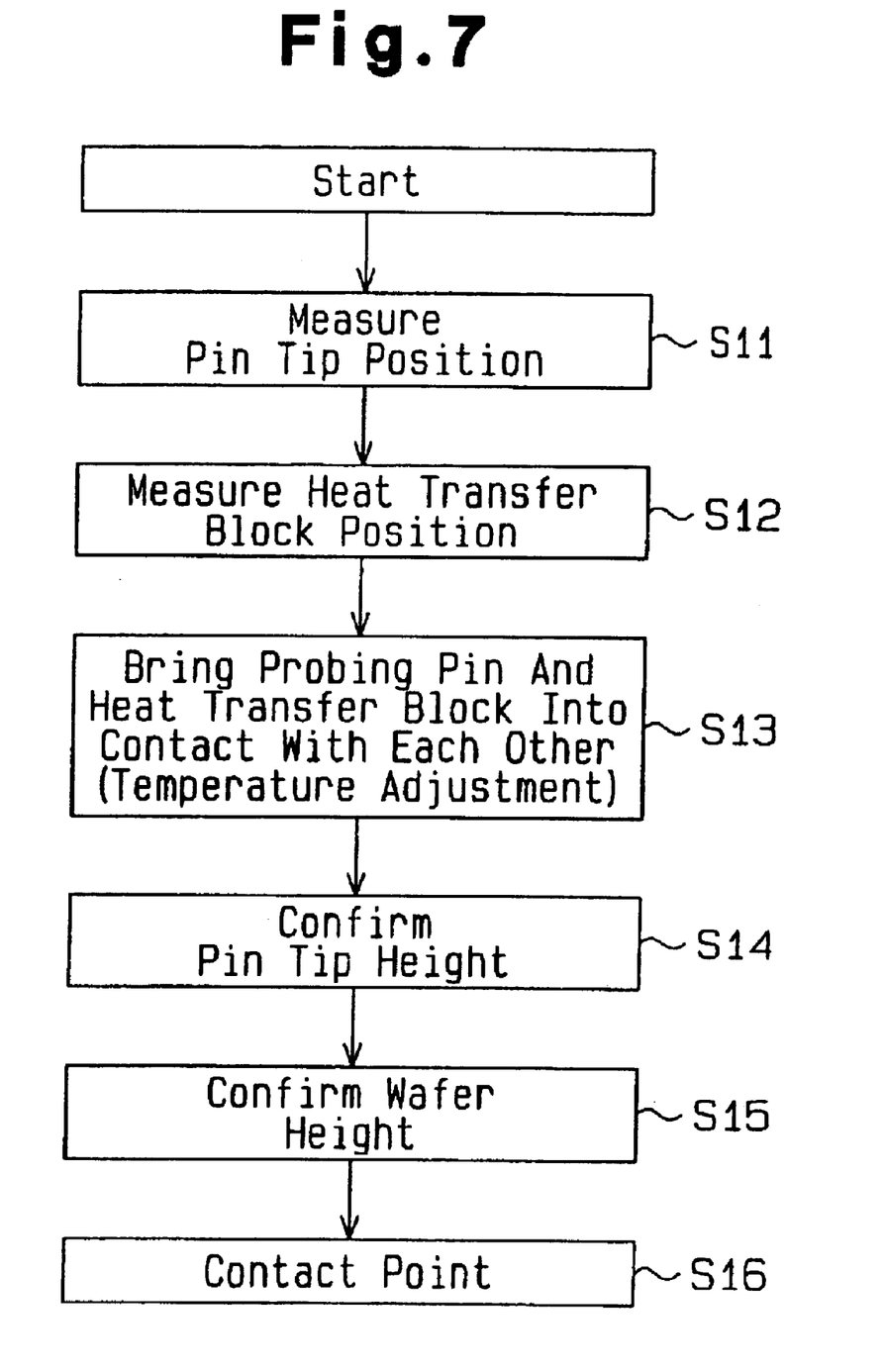
FIG. 7 is a flowchart for showing a sequence for the semiconductor testing apparatus.
Figure 8A:
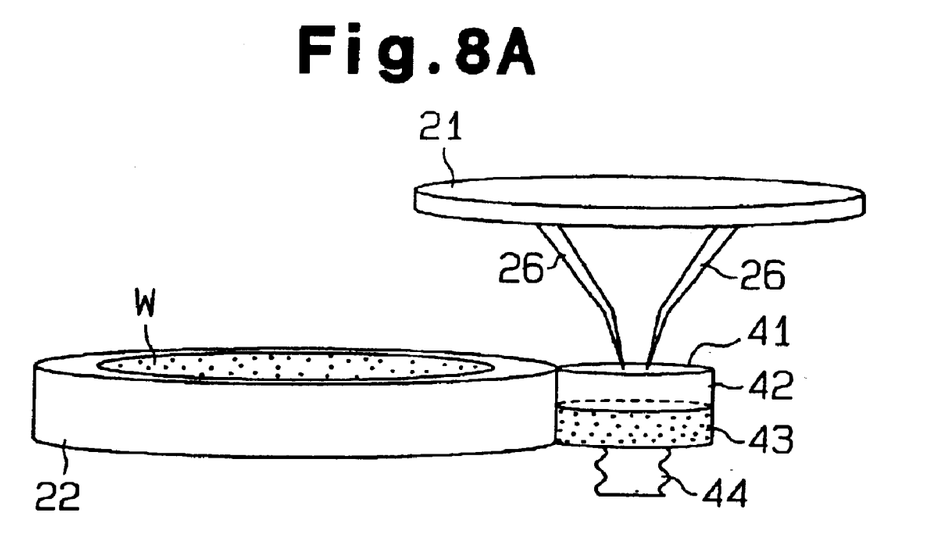
FIG. 8A is an illustration for showing a condition in step S13 of FIG. 7.
Figure 8B:
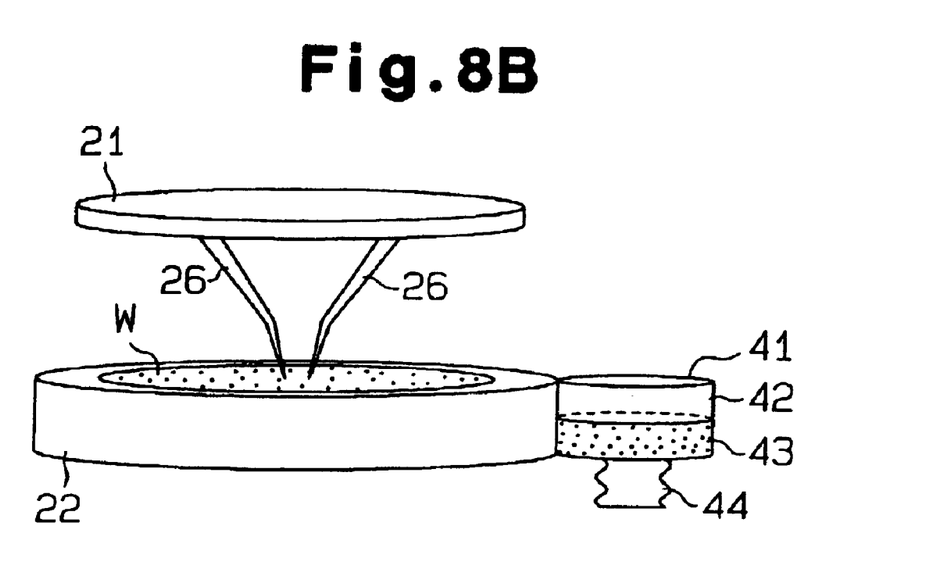
FIG. 8B is an illustration for showing a condition in step S16 of FIG. 7.

The following will describe a method for testing a semiconductor with reference to FIGS. 7 and 8.

Prior to testing, the heat transfer block 41 and the wafer W are held at the predetermined temperature. In step S11, the second camera 46 measures the position of the tip of the probing pin 26. In step S12, the first camera 45 measures the position of the upper surface of the heat transfer block 41.

The chuck controller 20 aligns the upper surface of the heat transfer block 41 and the tip of the probing pin 26 with each other. That is, as shown in FIG. 8A, the chuck controller 20 moves the chuck 22 and the heat transfer block 41 to bring the tip of the probing pin 26 into contact with the upper surface of the heat transfer block 41 at the predetermined pressure. The temperature of the probing pin 26 is adjusted to the testing temperature by the heat transfer block 41 held at the testing temperature (step S13).

Step S13 continues until a warp or an elongation of the probing card 21 is maximized. An influence of the elongation or shortening of the probing pin 26 owing to a temperature variation is accommodated by the pressure absorber 44, so that the probing pin 26 comes in contact with the contact member 42 stably.

In step S14, when the temperature of the probing pin 26 reaches the testing temperature, the position of the tip of the probing pin 26 is measured by the second camera 46. In step S15, the position of the upper surface of the wafer W is measured by the first camera 45.

In step S16, the chuck controller 20 aligns the upper surface of the wafer W and the tip of the probing pin 26 with each other. That is, as shown in FIG. 8B, the chuck controller 20 moves the chuck 22 so that a predetermined contact point (pad) on the upper surface of the wafer W may come in contact with the tip of the probing pin 26 at the predetermined pressure. In this condition, the measurement control unit 11a tests the electrical characteristics of an electronic circuit on the wafer W. Since the temperature of the probing pin 26 is substantially equal to that of the wafer W, the probing pin 26 does not elongate or is not shortened during testing.

The first embodiment has the following advantages.

(1) The probing pin 26 is directly heated or cooled by contact with the heat transfer block 41 and so its temperature is adjusted to the testing temperature which is substantially equal to the temperature of the wafer W. Accordingly, even when the probing pin 26 is brought into contact with the wafer W during the testing, the temperature of the probing pin 26 does not vary. Therefore, the probing pin 26 stays in contact with the wafer W at a stable pressure over a time lapse of from the early stage of the test (testing of the first electronic circuit on the wafer W) to the final stage of the test (testing of the last electronic circuit on the wafer W), so that the wafer can be tested stably. Furthermore, since the tip of the probing pin 26 can be brought into contact with the predetermined contact point (electrode of the electronic circuit on the wafer W), slippage (scrubbing amount) can be suppressed and uniformed, thus decreasing damages inflicted on the electrodes of the wafer W.

Since heat is transferred between the probing pin 26 and the heat transfer block 41 through direct contact, time is reduced as measured from a moment when the probing pin 26 is heated to the testing temperature to a moment when it is stabilized. Since no temperature setting heater is built in the probing card 21, noise due to a heater current does not occur.

(2) A fluctuation of a contact pressure between the heat transfer block 41 and the probing pin 26 is absorbed by the pressure absorber 44. Therefore, the probing pin 26 is prevented from being deformed by an excessive pressure when it is brought into contact with the heat transfer block 41. Furthermore, poor contact is prevented from occurring between the probing pin 26 and the heat transfer block 41, so that it does not take long time for the probing pin 26 to be heated to the testing temperature. In particular, it is possible to cope with a variation in pressure of contact corresponding to the number of the probing pins 26.

(3) The pressure absorber 44 which displaces the heat transfer block 41 in accordance with a fluctuation of a contact pressure of the probing pin 26 has a very simple displacement mechanism of a spring type or a hydraulic type. Therefore, increase in the costs for equipment is suppressed.

(4) Since the contact member 42 is made of an insulating material, the probing pins can be prevented from short-circuiting with each other through the contact member 42.

(5) Since the contact member 42 is made of a ceramic excellent in heat conduction, the temperature of the heat transfer block 41 can be readily adjusted to a predetermined testing temperature.

(6) Since the contact member 42 can be removed alone and replaced, the heat transfer block 41 can be maintained and repaired easily.

(7) A chuck heater 51 is provided also to a conventional chuck 90. The temperature setting element of the heat transfer block 41 is formed by extending the chuck heater 51 and the chuck cooling unit 54 thus suppressing increase in the costs of the equipment.

Figure 10:
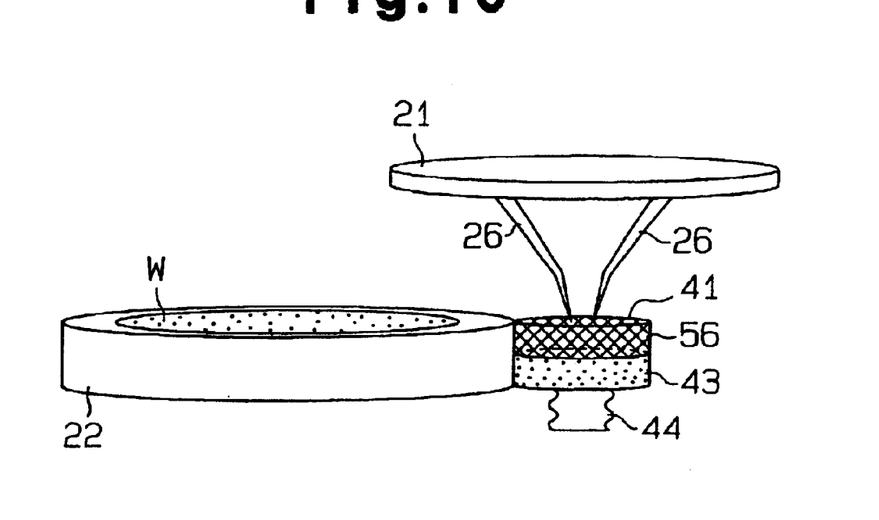
FIG. 10 shows a semiconductor testing apparatus according to a second embodiment of the present invention.

The following will describe a testing apparatus according to a second embodiment of the present invention with reference to FIG. 10. The second embodiment employs a contact member 56 made of a conductive gold plate. A pair of probing pins 26 are brought into contact with the contact member 56 to be made conductive with each other.

According to the second embodiment, the main controller 13 drives the probing card 21 to make conductive the pairs of the probing pins 26 in a predetermined order. The controller 13 serially transfers (in GP-IB communication etc.) to the measuring instrument 14 through the output cable 25 from the probing card 21 such data as to correspond to the resistance (contact resistance) of the probing pins 26 thus made conductive. Based on the data transferred to the measuring instrument 14, the main controller 13 can measure the resistance of each of the probing pins 26 to decide whether, for example, maintenance and repair are necessary.

To describe in detail, during testing or prior to it, the chuck controller 20 drives the chuck 22 and the heat transfer block 41 to bring the contact member 56 into contact with the probing pin 26. Then, a signal indicating the completion of the contact between the probing pin 26 and the contact member 56 is supplied through the control cable 23 to the main controller 13. When having confirmed this contact, the main controller 13 drives the probing card 21 through the probing card control cable 24 to make conductive the pairs of the probing pins 26 in the predetermined order, thus measuring the contact resistance thereof. The main controller 13 notifies the chuck controller 20 of the completion of contact resistance measurement through the control cable 23. Thus, it is possible to measure the contact resistance of the probing pins 26 in a condition where the probing card 21 is mounted, thus deciding whether maintenance and repair thereof is necessary.

The second embodiment has the following advantages in addition to the advantages (1) to (3), (6) and (7) of the first embodiment.

(8) It is possible to detect the resistance of the probing pins 26 by way of the contact member 56 made of a conductive material, to decide whether, for example, the maintenance and repair of these probing pins 26 (probing card 21) are necessary.

(9) According to the second embodiment, the data corresponding to the resistance of each of the probing pins 26 is transferred serially, so that the probing pins 26 can all be checked for whether they need to be maintained or repaired.

(10) According to the second embodiment, the contact member 56 is made of a gold plate having extremely high conductivity. It is, therefore, possible to reduce to a minimum the influence of the contact member 56 exerted on the detection of the resistance (contact resistance) of the probing pins 26.

Figure 11:
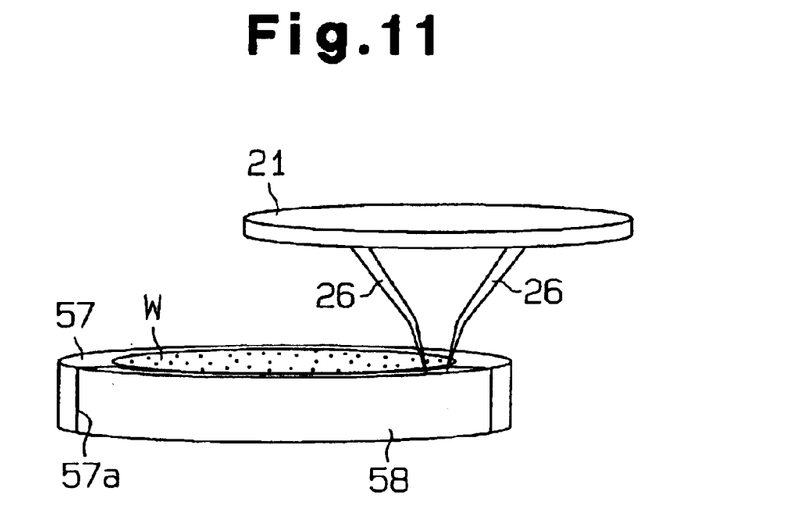
FIG. 11 shows a semiconductor testing apparatus according to a third embodiment of the present invention.

The following will describe a testing apparatus according to a third embodiment of the present invention with reference to FIG. 11.

The third embodiment employs a chuck 57 provided with a heat transfer block 58. The fan-shaped heat transfer block 58 is fitted into a notch 57a formed in a periphery of the chuck 57. The outer surface of the heat transfer block 58 continues with that of the chuck 57. Preferably the heat transfer block 58 is made of a high-resistance material excellent in, for example, heat conduction. The heat transfer block 58 can be removed from the chuck 57. The probing pin 26 is brought into contact with the upper surface of the heat transfer block 58 so that its temperature may be adjusted to the testing temperature.

The third embodiment has the following advantages in addition to the advantages (1), (4) and (5) of the first embodiment.

(11) According to the third embodiment, the heat transfer block 58 is provided at part of the chuck 57. Therefore, the heat transfer block 58 and the chuck 57 can be arranged in a relatively small space. The heat of the chuck 57 set to the testing temperature is transferred to the heat transfer block 58, the heat of which is in turn transferred to the probing pin 26. Therefore, the temperature setting element is simple.

(12) The heat transfer block 58 can be removed from the chuck 57 for replacement, so that they can be maintained and repaired easily.

It should be apparent to those skilled in the art that the present invention may be embodied in many other specific forms without departing from the spirit or scope of the invention.

In the first and second embodiments, the heat transfer block 41 may be brought into contact with the chuck 22 to transfer the heat of the chuck 22 directly to the heat transfer block 41. In this case, it may be possible to omit the heat transfer block 52 and the heat transfer block cooling unit 55 provided for heat exchange with the heat transfer block 41.

The heat transfer block 58 may be made of metal hardened and insulated so that it may be hardly deteriorated.

The heat transfer block 58 may be formed of a gold plate, which is conductive. In this case, the resistance of the probing pin 26 can be detected.

In the third embodiment, the heat transfer block 58 may be divided into upper and lower parts.

In the third embodiment, the heat transfer block 58 may be provided, on the bottom thereof, with the pressure absorber 44.

In each of the embodiments, the chuck controller 20 may be replaced by the main controller 13 to control the driving of the chucks 22 and 57. In this case, the chuck controller 20 is omitted.

Although in each of the embodiments, the main controller 13 controls measurement and the temperature controller 15 controls temperatures, either one of these may conduct control on both the measurement and the temperature.

The heater 51 and/or the cooling unit 54 for setting the temperature of the chucks 22 and 57 may be built in each of the chucks 22 and 57.

The heater 52 and/or the cooling unit 55 for setting the temperature of the heat transfer block 41 may be built in the support bench 43.

It is preferred that the time required to heat or cool the probing pin 26 to the testing temperature is measured in an experiment beforehand.

Therefore, the present examples and embodiments are to be considered as illustrative and not restrictive and the invention is not to be limited to the details given herein, but may be modified within the scope and equivalence of the appended claims.

What is claimed is:

1. An apparatus for testing a test piece, comprising:
    test bench for supporting the test piece while maintaining the test piece at a predetermined testing temperature;
    a heat transfer block which is brought into contact with a tip of a probing pin to adjust a temperature of the probing pin to the testing temperature.

2. The semiconductor testing apparatus according to claim 1, further comprising a pressure absorber which is attached to the heat transfer block to absorb a fluctuation of a contact pressure between the probing pin and the heat transfer block.

3. The semiconductor testing apparatus according to claim 2, wherein the pressure absorber has a displacement mechanism for displacing the heat transfer block in accordance with the fluctuation of the contact pressure, wherein the displacement mechanism is one of a spring type and a hydraulic type.

4. The semiconductor testing apparatus according to claim 1, wherein the heat transfer block is arranged in a region of the test bench.

5. The semiconductor testing apparatus according to claim 1, wherein the heat transfer block includes a contact member made of an insulating material which is brought into contact with the probing pin.

6. The semiconductor testing apparatus according to claim 5, wherein the contact member is made of a heat conduction type ceramic.

7. The semiconductor testing apparatus according to claim 5, wherein the contact member is made of metal which is hardened and insulated.

8. The semiconductor testing apparatus according to claim 5, wherein the contact member is removable from the heat transfer block.

9. The semiconductor testing apparatus according to claim 1, wherein the heat transfer block includes a contact member which is made of a conductive material and is brought into contact with the probing pin, and wherein the testing apparatus further comprises a detector for detecting resistance of the probing pin through the contact member.

10. The semiconductor testing apparatus according to claim 9, wherein the contact member is a gold plate.

11. The semiconductor testing apparatus according to claim 9, wherein the probing pin is one of the plurality of probing pins provided on a probing card, and wherein the detector includes an interface for connecting to the probing card and data of resistance of each of the probing pins is transferred through the interface to the detector.

12. The semiconductor testing apparatus according to claim 9, wherein the contact member is removable from the heat transfer block.

13. The semiconductor testing apparatus according to claim 1, wherein the heat transfer block is arranged in an outside of a chuck.

14. A semiconductor testing apparatus for testing a semiconductor wafer, comprising:
    a test bench for supporting the wafer;
    a probing card having probing pins which are brought into contact with the wafer;
    a heat transfer block which comes in contact with tips of the probing pins to adjust a temperature of the probing pins to a testing temperature, before the probing pins are brought into contact with the wafer; and
    a pressure absorber connected to the heat transfer block to maintain constant a pressure of contact between the probing pins and the heat transfer block.

15. The semiconductor testing apparatus according to claim 14, further comprising a temperature setting element for maintaining temperatures of the test bench and the heat transfer block at the testing temperature.

16. The semiconductor testing apparatus according to claim 15, wherein the temperature setting element includes a first heater for heating the test bench, and a second heater connected to the first heater in series for heating the heat transfer block.

17. The semiconductor testing apparatus according to claim 15, wherein the temperature setting element includes a first cooling unit for cooling the test bench, a second cooling unit for cooling the heat transfer block, and a cooling circuit for connecting the first cooling unit and the second cooling unit in series.

18. The semiconductor testing apparatus according to claim 14, wherein the heat transfer block includes a contact member an upper surface of which is brought into contact with tip of the probing pins, the upper surface of the contact member being at substantially the same level as an upper surface of the test bench.

19. A method for testing a semiconductor wafer by contacting a plurality of probing pins to the semiconductor wafer, comprising the steps of:

maintaining the wafer at a predetermined testing temperature;

maintaining a heat transfer block at the testing temperature;

contacting the tips of the plurality of probing pins to the beat transfer block until a temperature of the plurality of probing pins reaches the testing temperature; and contacting the plurality of probing pins to the wafer.

20. The method according to claim 19, wherein the step of contacting the tips of the probing pins to the heat transfer block includes a step of bringing the heat transfer block and the plurality of probing pins into contact with each other at a predetermined pressure.

* * * * *